US009232165B2

(12) United States Patent
Saito et al.

(10) Patent No.: US 9,232,165 B2
(45) Date of Patent: Jan. 5, 2016

(54) SOLID-STATE IMAGING APPARATUS AND METHOD FOR DRIVING SOLID-STATE IMAGING APPARATUS

(75) Inventors: Kazuhiro Saito, Tokyo (JP); Hiroki Hiyama, Sagamihara (JP); Tetsuya Itano, Sagamihara (JP); Kohichi Nakamura, Kawasaki (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 670 days.

(21) Appl. No.: 13/585,029

(22) Filed: Aug. 14, 2012

(65) Prior Publication Data

US 2013/0062503 A1 Mar. 14, 2013

(30) Foreign Application Priority Data

Sep. 8, 2011 (JP) ................................. 2011-196058

(51) Int. Cl.
*H01L 27/146* (2006.01)
*H04N 5/378* (2011.01)
*H04N 5/357* (2011.01)
*H03M 1/08* (2006.01)

(52) U.S. Cl.
CPC .................. *H04N 5/378* (2013.01); *H03M 1/08* (2013.01); *H04N 5/357* (2013.01); *H04N 5/3575* (2013.01)

(58) Field of Classification Search
CPC ............ H04N 5/3575; H04N 5/37455; H04N 5/3745; H04N 5/378; H04N 5/357; H04N 5/335; H04N 5/374; H04N 5/369; H03M 1/56; H03M 1/123; H03M 1/08

See application file for complete search history.

(56) References Cited

U.S. PATENT DOCUMENTS

| 4,940,982 | A | * | 7/1990 | Gulczynski | .................... 341/169 |
|---|---|---|---|---|---|
| 5,736,879 | A | * | 4/1998 | Pham | ............................. 327/102 |
| 6,188,094 | B1 | | 2/2001 | Kochi et al. | .................... 257/232 |

(Continued)

FOREIGN PATENT DOCUMENTS

| CN | 1812508 | 8/2006 |
|---|---|---|
| CN | 101621637 | 1/2010 |

(Continued)

OTHER PUBLICATIONS

U.S. Appl. No. 13/540,285, filed Jul. 2, 2012.

(Continued)

*Primary Examiner* — John Lee
(74) *Attorney, Agent, or Firm* — Fitzpatrick, Cella, Harper & Scinto

(57) ABSTRACT

A solid-state imaging apparatus includes: a ramp signal generator for generating first and second time-changing ramp signals during first and second analog-to-digital conversion periods, respectively; comparators for comparing a reset signal of a pixel with the first ramp signal during the first analog-to-digital conversion period, and comparing a pixel signal with the second ramp signal during the second analog-to-digital conversion period; and memories for storing, as first and second digital data, count values of counting from a start of changing the first and second ramp signals until an inversion of outputs of the comparators, during the first and second analog-to-digital conversion periods, wherein the ramp signal generator supplies a current from a current generator to a first capacitor element by a sampling and holding operation of a switch, and generates the first and second ramp signals based on the same bias voltage held by the first capacitor element.

14 Claims, 5 Drawing Sheets

(56) References Cited

U.S. PATENT DOCUMENTS

| | | | |
|---|---|---|---|
| 6,545,624 B2* | 4/2003 | Lee et al. | 341/155 |
| 6,670,990 B1 | 12/2003 | Kochi et al. | 348/310 |
| 6,873,363 B1 | 3/2005 | Barna et al. | |
| 6,956,413 B2* | 10/2005 | Bailey | 327/131 |
| 6,960,751 B2 | 11/2005 | Hiyama et al. | 250/208.1 |
| 7,110,030 B1 | 9/2006 | Kochi et al. | 348/308 |
| 7,126,102 B2 | 10/2006 | Inoue et al. | 250/214 |
| 7,187,052 B2 | 3/2007 | Okita et al. | 257/444 |
| 7,218,260 B2 | 5/2007 | Lim | |
| 7,283,305 B2 | 10/2007 | Okita et al. | 359/619 |
| 7,321,110 B2 | 1/2008 | Okita et al. | 250/208.1 |
| 7,408,210 B2 | 8/2008 | Ogura et al. | 257/233 |
| 7,429,764 B2 | 9/2008 | Koizumi et al. | 257/292 |
| 7,460,162 B2 | 12/2008 | Koizumi et al. | 348/294 |
| 7,462,810 B2 | 12/2008 | Kobayashi et al. | 250/208.1 |
| 7,528,878 B2 | 5/2009 | Sato et al. | 348/317 |
| 7,538,804 B2 | 5/2009 | Okita et al. | 348/241 |
| 7,550,793 B2 | 6/2009 | Itano et al. | 257/239 |
| 7,557,847 B2 | 7/2009 | Okita et al. | 348/308 |
| 7,626,532 B2 | 12/2009 | Maruyama | |
| 7,629,914 B2 | 12/2009 | Muramatsu et al. | |
| 7,638,826 B2 | 12/2009 | Hiyama et al. | 257/291 |
| 7,719,587 B2 | 5/2010 | Ogura et al. | 348/302 |
| 7,741,593 B2 | 6/2010 | Iwata et al. | 250/214 |
| 7,755,688 B2 | 7/2010 | Hatano et al. | 348/300 |
| 7,812,873 B2 | 10/2010 | Hiyama et al. | 348/294 |
| 7,812,876 B2 | 10/2010 | Hiyama et al. | 348/300 |
| 7,825,974 B2 | 11/2010 | Itano et al. | 348/308 |
| 7,920,192 B2 | 4/2011 | Watanabe et al. | 348/308 |
| 7,982,789 B2 | 7/2011 | Watanabe et al. | 348/308 |
| 8,023,025 B2 | 9/2011 | Itano et al. | 348/308 |
| 8,045,034 B2 | 10/2011 | Shibata et al. | 348/308 |
| 8,081,245 B2 | 12/2011 | Itano et al. | 348/301 |
| 8,085,319 B2 | 12/2011 | Ono et al. | 348/241 |
| 8,106,955 B2 | 1/2012 | Okita et al. | 348/220.1 |
| 8,120,686 B2 | 2/2012 | Hatano et al. | 348/308 |
| 8,159,577 B2 | 4/2012 | Iwata et al. | 348/296 |
| 8,208,055 B2 | 6/2012 | Hiyama | 348/300 |
| 8,218,050 B2 | 7/2012 | Ogura et al. | 348/308 |
| 8,274,416 B2 | 9/2012 | Kawaguchi et al. | |
| 8,289,431 B2 | 10/2012 | Itano | 348/308 |
| 8,325,260 B2 | 12/2012 | Yamazaki et al. | 348/308 |
| 8,553,118 B2 | 10/2013 | Saito et al. | |
| 8,674,865 B2* | 3/2014 | Asayama et al. | 341/144 |
| 2003/0071666 A1* | 4/2003 | Bailey | 327/131 |
| 2005/0007164 A1* | 1/2005 | Callahan, Jr. | 327/133 |
| 2007/0008015 A1* | 1/2007 | Hershbarger | 327/53 |
| 2007/0194962 A1 | 8/2007 | Asayama et al. | |
| 2009/0021411 A1 | 1/2009 | Maruyama | |
| 2009/0219424 A1 | 9/2009 | Sonoda et al. | 348/302 |
| 2009/0322922 A1 | 12/2009 | Saito et al. | 348/308 |
| 2010/0026545 A1* | 2/2010 | Delagnes | 341/156 |
| 2010/0029228 A1* | 2/2010 | Holden et al. | 455/127.1 |
| 2010/0060762 A1 | 3/2010 | Takada et al. | 348/300 |
| 2010/0238057 A1* | 9/2010 | Wood | 341/124 |
| 2010/0271521 A1 | 10/2010 | Kawaguchi et al. | |
| 2010/0295978 A1 | 11/2010 | Nakamura et al. | 348/273 |
| 2011/0037868 A1* | 2/2011 | Ota | 348/222.1 |
| 2011/0169990 A1* | 7/2011 | Higuchi et al. | 348/302 |
| 2011/0199526 A1* | 8/2011 | Nitta et al. | 348/308 |
| 2011/0215222 A1* | 9/2011 | Eminoglu et al. | 250/208.1 |
| 2011/0221942 A1* | 9/2011 | Taura | 348/294 |
| 2011/0240833 A1* | 10/2011 | Gravot | 250/208.2 |
| 2011/0291870 A1* | 12/2011 | Liu | 341/155 |
| 2012/0026371 A1 | 2/2012 | Itano et al. | 348/301 |
| 2012/0161998 A1* | 6/2012 | Burm et al. | 341/155 |
| 2012/0169909 A1* | 7/2012 | Rysinski et al. | 348/302 |
| 2012/0194367 A1* | 8/2012 | Wang | 341/120 |
| 2013/0062503 A1* | 3/2013 | Saito et al. | 250/208.1 |
| 2013/0141059 A1* | 6/2013 | Parkhurst et al. | 323/271 |

FOREIGN PATENT DOCUMENTS

| | | |
|---|---|---|
| CN | 101826867 | 9/2010 |
| JP | 2002-232291 | 8/2002 |
| JP | 2008042521 A | 2/2008 |
| JP | 2008187420 A | 8/2008 |
| JP | 2009-33305 A | 2/2009 |
| JP | 2009033305 A | 2/2009 |
| JP | 2010-258737 | 11/2010 |
| JP | 2010258737 A | 11/2010 |

OTHER PUBLICATIONS

U.S. Appl. No. 13/586,956, filed Aug. 16, 2012.
U.S. Appl. No. 13/591,903, filed Aug. 22, 2012.
U.S. Appl. No. 13/611,476, filed Sep. 12, 2012.
U.S. Appl. No. 13/614,121, filed Sep. 13, 2012.
U.S. Appl. No. 13/624,183, filed Sep. 21, 2012.
U.S. Appl. No. 13/670,175, filed Nov. 6, 2012.

* cited by examiner

SOLID-STATE IMAGING APPARATUS AND METHOD FOR DRIVING SOLID-STATE IMAGING APPARATUS

BACKGROUND OF THE INVENTION

1. Field of the Invention

The present invention relates to a solid-state imaging apparatus and a method for driving solid-state imaging apparatus.

2. Description of the Related Art

A CMOS image sensor including an analog-to-digital (AD) conversion circuit has been used in an image input device such as a digital camera. The AD conversion circuit compares an image signal with a reference signal to obtain digital data. As a reference signal, a ramp signal having a time-changing signal level and generated by controlling a charging current for a capacitor element is described in Japanese Patent Application Laid-Open No. 2009-33305.

SUMMARY OF THE INVENTION

However, noise superimposed on the ramp signal provided in common to the AD conversion circuit provided in each column appears as stripe shaped noise on an image. In a ramp signal (reference voltage) generation circuit disclosed in Japanese Patent Application Laid-Open No. 2009-33305, a reference voltage supplied from outside, or a reference current generated from a built-in band gap reference voltage includes a noise component. A voltage corresponding to charging of a capacitor with a reference current becomes a ramp signal, and at this time, particularly by an influence of a low-frequency component of noise, slopes of ramp signals vary depending on rows, and a difference between the slopes is detected as stripe shaped noise on an image.

According to an aspect of the present invention, a solid-state imaging apparatus comprises: a pixel unit including a plurality of pixels for photoelectric conversion arranged in a matrix; a ramp signal generator configured to generate a first time-changing ramp signal during a first analog-to-digital conversion period, and to generate a second time-changing ramp signal during a second analog-to-digital conversion period; a plurality of comparators each arranged correspondingly to each of columns of the matrix; and a plurality of memories each arranged correspondingly to each of columns of the matrix, wherein the comparator compares the first time-changing ramp signal with a signal according to a release of reset of the pixel during the first analog-to-digital conversion period, and compares the second time-changing ramp signal with a signal according to the photoelectric conversion of the pixel during the second analog-to-digital conversion period, the memory stores, as a first digital data, a count value of counting from a start of changing the first ramp signal until an inversion of an output of the comparator, during the first analog-to-digital conversion period, the memory stores, as a second digital data, a count value of counting from a start of changing the second ramp signal until the inversion of the output of the comparator, during the second analog-to-digital conversion period, and the ramp signal generator supplies a current from a current generator to a first capacitor element, and generates the first and second ramp signals based on a bias voltage held by the first capacitor element at a single timing.

Since the first and second ramp signals are generated based on the same bias voltage held by the first capacitor element at a single timing, the stripe shaped noise on the image is suppressed.

Further features of the present invention will become apparent from the following description of exemplary embodiments with reference to the attached drawings.

DESCRIPTION OF THE EMBODIMENTS

Embodiments of the present invention will now be described in detail in accordance with the accompanying drawings.

First Embodiment

Figure 1:
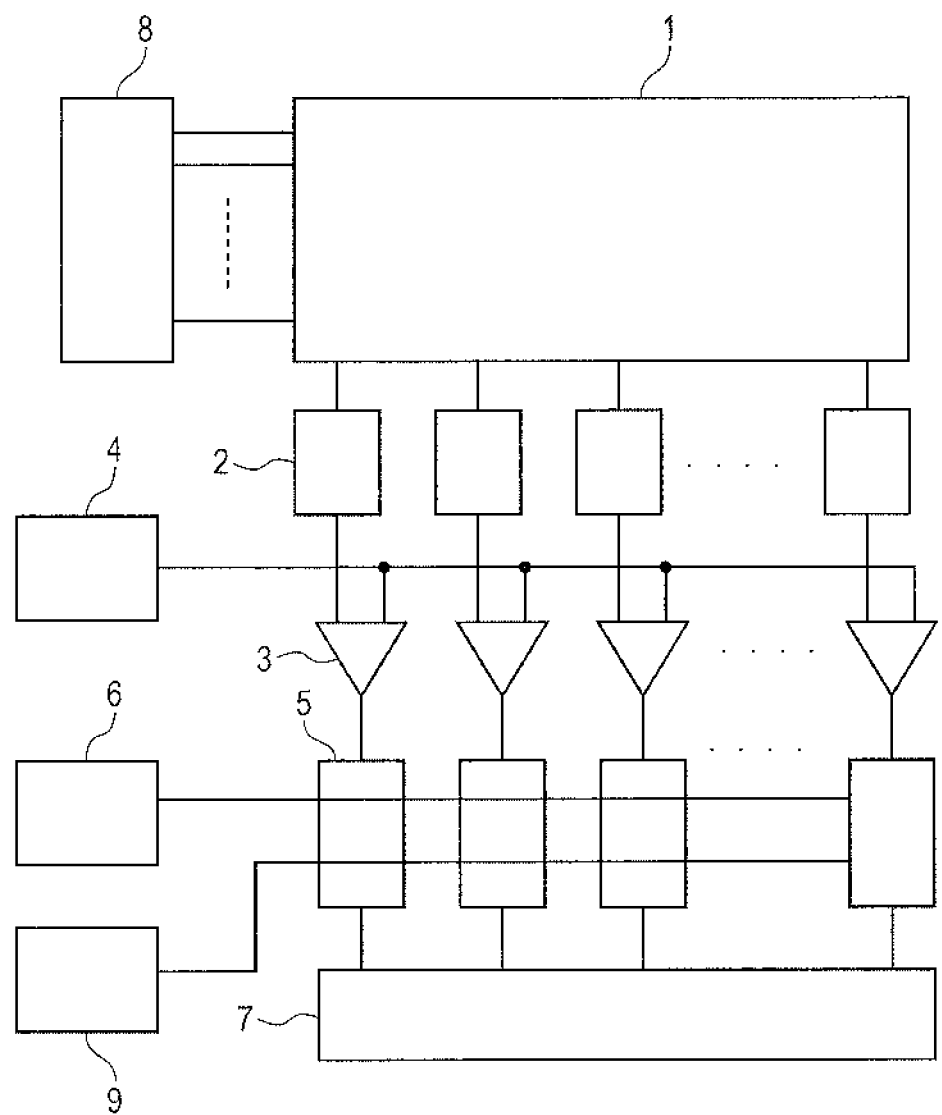
FIG. 1 illustrates a circuit configuration example of a solid-state imaging apparatus according to a first embodiment of the present invention.
Figure 4:
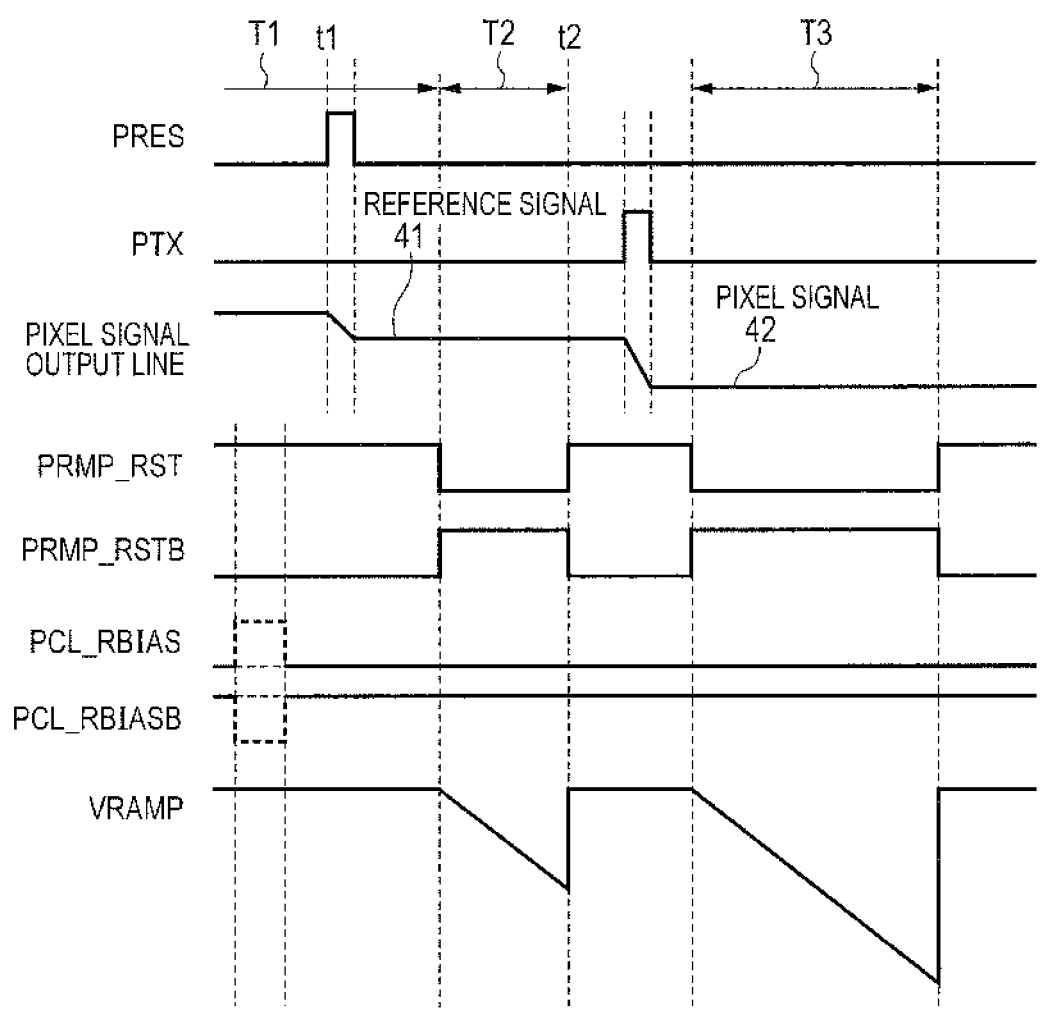
FIG. 4 is a driving timing chart of the ramp signal generator and the pixel unit.

FIG. 1 illustrates a circuit configuration example of a solid-state imaging apparatus according to a first embodiment of the present invention. The solid-state imaging apparatus includes a pixel unit 1, an amplifier circuit 2, a comparator 3, a ramp signal generator 4, a memory 5, a counter circuit 6, a horizontal scanning circuit 7, a vertical scanning circuit 8, and a signal processing circuit 9. The pixel unit 1 includes a plurality of pixels that are arranged in a two-dimensional matrix, and generate signals by photoelectric conversion. Each pixel generates an analog pixel signal by photoelectric conversion of a photoelectric conversion element. The amplifier circuit 2 is arranged for each column of the pixel unit 1 and amplifies a signal of the pixel unit 1. The ramp signal generator 4 is connected in common to a plurality of comparators 3, and provides a ramp signal. As illustrated in FIG. 4, the ramp signal VRAMP is a time-changing ramp-type signal. The comparator 3 includes a differential-input comparator, is arranged for each column of the pixel unit 1, and compares an output signal of the amplifier circuit 2 with the ramp signal. The counter circuit 6 is connected in common to the memories 5 in a plurality of columns, and starts counting when generation of a ramp signal is started. The memory 5 is arranged for each column. The comparator 3 compares the output signal of the amplifier circuit 2 with the ramp signal generated by the ramp signal generator 4. When a magnitude relation of potentials between the output signal of the amplifier circuit 2 and the ramp signal is inverted, the output of the comparator 3 transits from a high level to a low level or from the low level to the high level. At this transition timing, the memory 5 stores a counter value output from the counter circuit 6 as a digital data. The digital data is analog-to-digital converted data of a pixel signal. The digital data stored in the memory 5 in each column is successively transferred to the signal processing circuit 9 by signals output from the horizontal scanning circuit 7. The signal processing circuit 9 performs signal processing to output a signal. The memory 5 stores a digital data for a reference signal and a digital data for an image signal. The number of data that can be stored in the memory 5 may be one or more depending on configurations.

The series of operations are performed by the vertical scanning circuit 8 while properly selecting a pixel row of the pixel unit 1.

Figure 2:
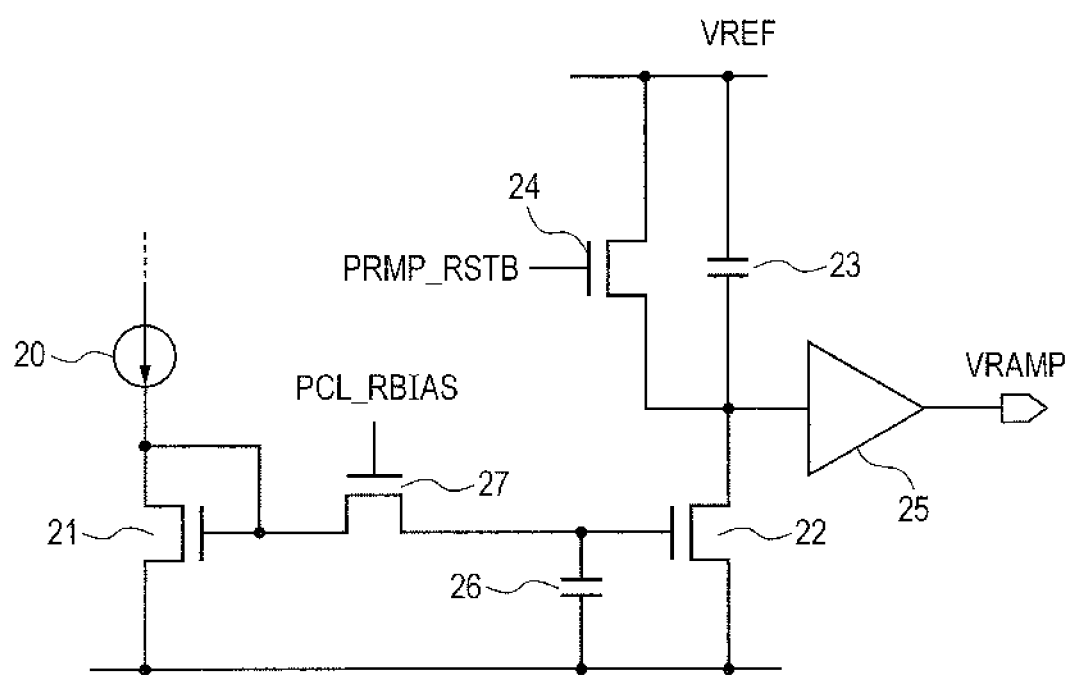
FIG. 2 illustrates a configuration example of a ramp signal generator in the first embodiment of the present invention.

FIG. 2 illustrates a circuit configuration example of the ramp signal generator 4 in the first embodiment of the present invention. A constant current generator 20 generates a reference current outside or inside the solid-state imaging apparatus, and the reference current is supplied to a current mirror circuit. The current mirror circuit includes a first NMOS transistor (first transistor) 21 that has a drain terminal and a gate terminal connected and supplies a bias voltage, and a second NMOS transistor (second transistor) 22 that receives the bias voltage at a gate terminal. The current generator 20 is connected to the drain terminal and the gate terminal of the first NMOS transistor 21. A first capacitor element is connected between the gate terminal and a source terminal of the second NMOS transistor 22. A switch NMOS transistor 27 is connected between the gate terminal of the first NMOS transistor 21 and the gate terminal of the second NMOS transistor 22. A second capacitor element 23 is connected to a drain terminal of the second NMOS transistor 22 and an input terminal of a buffer circuit 25, converts an output current of the drain terminal of the second NMOS transistor 22 to a voltage, and generates a ramp voltage. A reset PMOS switch 24 resets charges accumulated in the second capacitor element 23 by a signal PRMP_RSTB. The buffer circuit 25 buffers the ramp voltage generated by the second capacitor element 23, and outputs a time-changing ramp signal VRAMP. The first capacitor element 26 and the switch NMOS transistor 27 are sampling and holding switches for sampling and holding the bias voltage at the gate terminal of the NMOS transistor 22 by a signal PCL_RBIAS.

Figure 3:
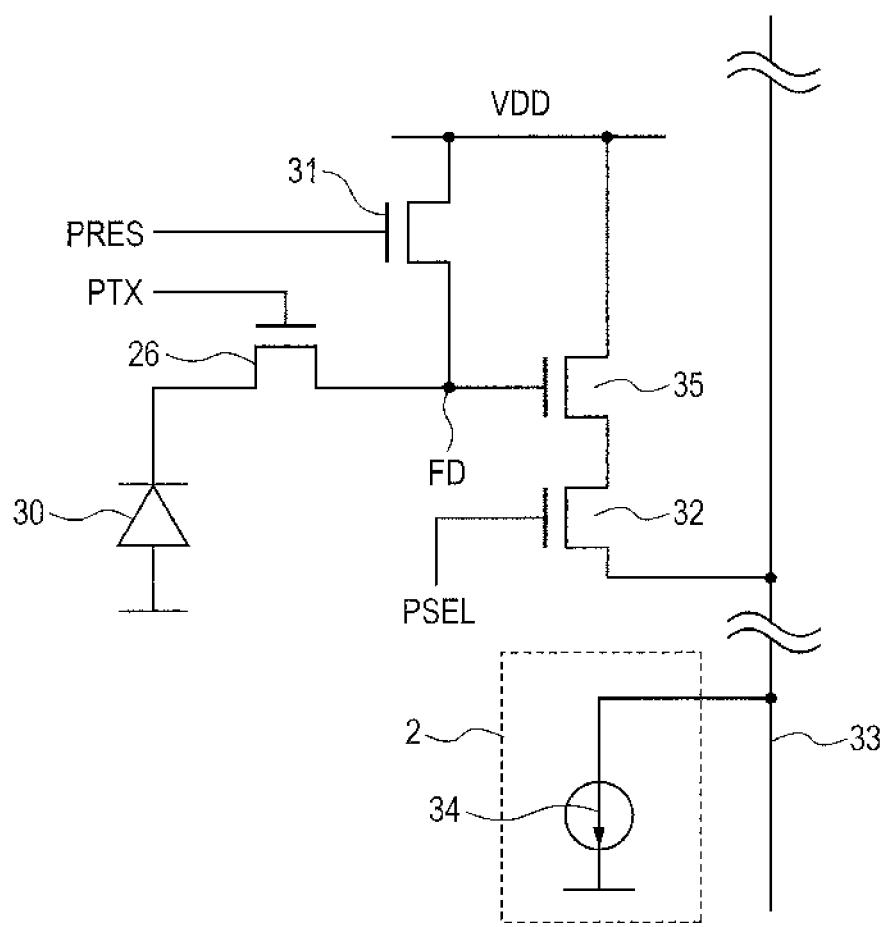
FIG. 3 illustrates a configuration example of a pixel unit in the first embodiment of the present invention.

FIG. 3 is a schematic circuit diagram of one pixel including a photoelectric conversion element 30 and four transistors in the pixel unit 1. Reference numeral 30 denotes a photoelectric conversion element. Reference numeral 31 denotes a reset MOS transistor. Reference numeral 32 denotes a selecting MOS transistor. Reference numeral 33 denotes a pixel signal output line. Reference numeral 34 denotes a source follower constant current generator. Reference numeral 35 denotes a source follower MOS transistor. Reference numeral 36 denotes a transferring MOS transistor. The photoelectric conversion element 30 is, for example, a photo diode, and generates an electric signal by photoelectric conversion. The transferring MOS transistor 36 is turned on when a signal PTX reaches a high level, and transfers the signal of the photoelectric conversion element 30 to a floating diffusion FD. The selecting MOS transistor 32 is turned on when a signal PSEL reaches a high level, and connects a source terminal of the source follower MOS transistor 35 to the pixel signal output line 33. The source follower MOS transistor 35 amplifies a voltage of the floating diffusion FD and outputs the voltage from the source terminal. The reset MOS transistor 31 is turned on when a signal PRES reaches a high level, and resets the voltage of the floating diffusion FD and/or the photoelectric conversion element 30. The amplifier circuit 2 includes the source follower constant current generator 34 connected to the pixel signal output line 33.

FIG. 4 is a timing chart for one pixel row for describing a circuit operation of the pixel in FIG. 3 and a circuit operation of the ramp signal generator 4 in FIG. 2. The pixel selecting signal PSEL in FIG. 3 reaches a high level when falling under a row for reading a pixel signal, which is omitted in the timing chart in FIG. 4. At a beginning of one-row operation, the ramp signal generator 4 turns on the switch NMOS transistor 27 by a high level pulse of the signal PCL_RBIAS. Thus, the ramp signal generator 4 performs a sampling and holding operation of a value of a current supplied from the constant current generator 20 and a bias voltage for a ramp current determined by the current mirror NMOS transistor 21. Specifically, the switch NMOS transistor 27 is turned on at the high level of the signal PCL_RBIAS to sample the bias voltage for a ramp current and accumulate the bias voltage in the first capacitor element 26. Then, the switch NMOS transistor 27 is turned off at the low level of the signal PCL_RBIAS, and the bias voltage for a ramp current is held by the first capacitor element 26. The sampling and holding operation may be performed once a few rows, or every other row. Even if noise is superimposed on the reference current from the current generator 20, the first capacitor element 26 holds the bias voltage for a ramp current and thus the bias voltage becomes a fixed voltage. Thus, a reference signal 41 from a pixel described later and a ramp signal in analog-to-digital conversion of a pixel signal 42 have the same slope, thereby reducing stripe shaped noise on the image.

The current mirror NMOS transistor 22 supplies a ramp current determined by the sampled and held bias voltage to the second capacitor element 23. During a period T1 before the AD conversion operation is performed, the control signal PRMP_RSTB is at a low level, the reset PMOS switch 24 is turned on, and the second capacitor element 23 is reset to a ramp reference voltage VREF. In the pixel unit 1, during reading, at a time t1, the signal PRES reaches a high level, the reset transistor 31 is turned on, and the floating diffusion FD is reset to a voltage VDD. Then, the signal PRES becomes a low level, the reset transistor 31 is turned off, and a signal (hereinafter referred to as a reference signal) 41 of a pixel in a releasing reset of a pixel in the pixel unit 1 is output to the pixel signal output line 33 downstream of the amplifier circuit 2. The time of the releasing reset is not limited to the time of a releasing reset of a pixel. The time of the releasing reset may be the time of a releasing reset of, for example, an amplifier when the amplifier is interposed between the pixel and the analog-to-digital conversion circuit, or may be the time of a releasing reset of an input/output terminal of the comparator 3 when the input/output terminal is reset. First analog-to-digital conversion of the reference signal 41 is performed during a first analog-to-digital conversion period T2. In an early stage of the first analog-to-digital conversion period T2, the signal PRMP_RSTB reaches a high level, the reset PMOS switch 24 is turned off, and reset of the second capacitor element 23 is released. Then, a ramp signal having a slope determined by the second capacitor element 23 and the ramp current supplied from the NMOS transistor 22 is charged from the ramp reference voltage VREF to the second capacitor element 23. The buffer circuit 25 buffers the ramp signal, and generates a time-changing first ramp signal VRAMP. The comparator 3 compares the first ramp signal VRAMP output from the buffer circuit 25 with the reference signal 41, and when a magnitude relation of potentials between the signals is inverted, an output signal from the comparator 3 transits in an inverted manner from a high level to a low level or from the low level to the high level. At this transition timing of the output potential of the comparator 3, the memory 5 stores a counter value output from the counter circuit 6 as a first digital data. The first digital data is a count value of counting from a start of changing the first ramp signal VRAMP until an inversion of an output potential of the comparator 3, and an analog to digital converted data of the reference signal 41.

Then, to perform second AD conversion for a photoelectric conversion signal, at a time t2, the signal PRMP_RSTB becomes a low level, the reset PMOS switch 24 is turned on, and the second capacitor element 23 is reset to the ramp reference voltage VREF. Then, in the pixel unit 1, the signal PTX reaches a high level, the transferring MOS transistor 36 is turned on, and charges accumulated in the photoelectric conversion element 30 are transferred to the floating diffusion FD. At this time, on the pixel signal output line 33 downstream of the amplifier circuit 2, the photoelectric conversion signal of the photoelectric conversion element 30 is superimposed on the reference signal 41 and output as the pixel signal 42. The pixel signal 42 is a signal of a pixel when the pixel signal of the pixel in the pixel unit 1 is output. During a second analog-to-digital conversion period T3, as during the first analog-to-digital conversion period T2, the signal PRM-P_RSTB reaches a high level, second AD conversion of the pixel signal 42 is performed, and a second digital data is stored in the memory 5. Specifically, the buffer circuit 25 generates a time-changing second ramp signal VRAMP. The comparator 3 compares the second ramp signal VRAMP generated by the buffer circuit 25 with the pixel signal 42, and when a magnitude relation of potentials between the signals is inverted, an output signal from the comparator 3 transits from the high level to the low level or from the low level to the high level. At this transition timing of the output potential of the comparator 3, the memory 5 stores a counter value output from the counter circuit 6 as a second digital data. The second digital data is a count value of counting from a start of changing the second ramp signal VRAMP until an inversion of an output potential of the comparator 3, and an analog to digital converted data of the pixel signal 42.

The first and second digital data stored in the memory 5 in each column are transferred by the horizontal scanning circuit 7 to the signal processing circuit 9. At this time, the first and second digital data are AD converted by a ramp signal determined by a current generated from the same bias voltage sampled and held. The ramp signal generator 4 supplies a current from the current generator 20 to the first capacitor element 26 by a sampling and holding operation of the switch 27 according to a high level pulse of the signal PCL_RBIAS. Then, the ramp signal generator 4 generates, based on the same bias voltage held by the first capacitor element 26, the first ramp signal VRAMP during the first analog-to-digital conversion period T2 and the second ramp signal VRAMP during the second analog-to-digital conversion period T3. Even if noise is superimposed on the reference current from the current generator 20, the first capacitor element 26 holds the bias voltage for a ramp current and thus the bias voltage becomes a fixed voltage. Thus, the reference signal 41 and the ramp signal in the analog-to-digital conversion of the pixel signal 42 have the same slope, thereby reducing stripe shaped noise on the image. The signal processing circuit 9 outputs a difference between the first and second digital data by Correlated Double Sampling (CDS) of the first and second digital data. Thus, components of the reference signal 41 in the reset can be removed from the pixel signal 42, thereby reducing noticeable stripe shaped noise near a dark signal in particular. The difference process between the first and second digital data may be performed outside the solid-state imaging apparatus rather than in the signal processing circuit 9.

Second Embodiment

Figure 5:
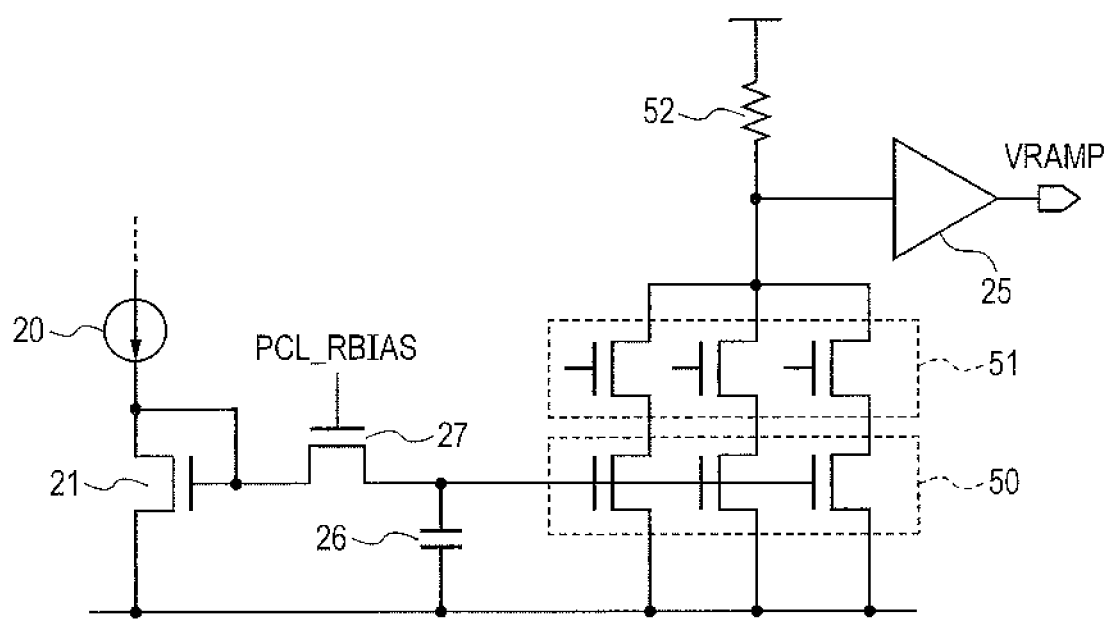
FIG. 5 illustrates a configuration example of a ramp signal generator in a second embodiment of the present invention.

FIG. 5 illustrates a circuit configuration example of a ramp signal generator 4 according to a second embodiment of the present invention. Now, differences between this embodiment and the first embodiment will be described. A circuit in FIG. 5 includes a plurality of current mirror NMOS transistors 50, a plurality of switching MOS transistors 51, and a resistor element 52 instead of the NMOS transistor 22, the second capacitor element 23, and the PMOS switch 24 in the circuit in FIG. 2. In FIG. 5, the same reference numerals as in FIG. 2 denote the same components, and descriptions thereof will be omitted. The second NMOS transistor 50 corresponds to the second NMOS transistor 22 in FIG. 2. The plurality of switching MOS transistors 51 is connected to the plurality of second NMOS transistors 50, respectively. A series connection circuit of the plurality of second NMOS transistors 50 and the plurality of switching MOS transistors 51 are connected between a reference potential node and an input terminal of a buffer circuit 25. A bias voltage of a first capacitor element 26 is input to gate terminals of the plurality of second NMOS transistors 50 to supply a ramp current to the resistor element 52. The resistor element 52 is connected via the switching MOS transistor 51 to the second NMOS transistor 50, connected to the input terminal of the buffer circuit 25, converts an output current of the second NMOS transistor 50 to a voltage, and generates a ramp voltage. The buffer circuit buffers the ramp voltage generated by the resistor element 52 and outputs a ramp signal VRAMP. The ramp signal generator 4 can change the number of the second NMOS transistors 50 connected in parallel to the input terminal of the buffer circuit 25 by switching the plurality of switching MOS transistors 51. This can easily change a slope of the ramp signal VRAMP, thereby allowing gain control of an image signal. A signal PRMP_RSTB in FIG. 2 is input to the gate terminals of the plurality of switching MOS transistors 51.

Third Embodiment

Figure 6:
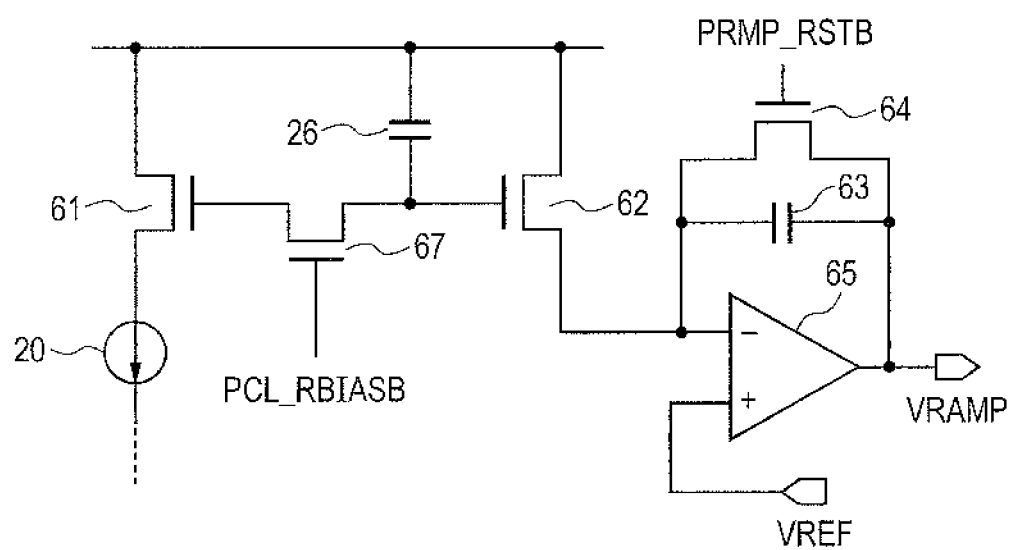
FIG. 6 illustrates a configuration example of a ramp signal generator in a third embodiment of the present invention.

FIG. 6 illustrates a circuit configuration example of a ramp signal generator 4 according to a third embodiment of the present invention. Now, differences between this embodiment and the first embodiment will be described. In FIG. 6, the same reference numerals as in FIG. 2 denote the same components, and descriptions thereof will be omitted. In this embodiment, a current mirror circuit that generates a ramp current includes PMOS transistors 61 and 62. The first PMOS transistor 61 corresponds to the first NMOS transistor 21 in FIG. 2, the second PMOS transistor 62 corresponds to the second NMOS transistor 22 in FIG. 2, and a PMOS transistor 67 corresponds to the NMOS transistor 27 in FIG. 2. A signal PCL_RBIASB is input to a gate terminal of the PMOS transistor 67. As illustrated in FIG. 4, the signal PCL_RBIASB is a logically inverted signal of the signal PCL_RBIAS. The PMOS transistor 67 is turned on to sample a bias voltage for a ramp current, and then the PMOS transistor 67 is turned off to hold the bias voltage for a ramp current in the first capacitor element 26. Even if noise is superimposed on a reference current from a current generator 20, the first capacitor element 26 holds the bias voltage for a ramp current and thus the bias voltage becomes a fixed voltage. Thus, a reference signal 41 and a ramp signal in AD conversion of a pixel signal 42 have the same slope, thereby reducing stripe shaped noise on an image. A ramp signal VRAMP is generated by a differential amplifier 65 that constitutes an integrating amplifier, a feedback capacitor 63 that converts a ramp current to a voltage and generates a ramp signal, and a reset MOS transistor 64 that resets charges in the feedback capacitor 63. The differential amplifier 65 inputs an output from the second PMOS transistor 62 to an inverted input terminal, inputs a reference voltage VREF to a non-inverted input terminal, and outputs the ramp signal VRAMP from an output terminal. The feedback capacitor 63 is connected between the inverted input terminal and the output terminal of the differential amplifier 65. The signal PRMP_RSTB is input to a gate terminal of the reset MOS transistor 64. The reset MOS transistor 64 is a reset switch for resetting the feedback capacitor 63. By the configuration in FIG. 6, the ramp signal generator 4 can generate a first ramp signal VRAMP during a first analog-to-digital conversion period T2 and generate a second ramp signal VRAMP during a second analog-to-digital conversion period T3 as in FIG. 4. Similarly to the plurality of second NMOS transistors 50 and the plurality of switching MOS transistors 51 in FIG. 5, a plurality of second PMOS transistors and a plurality of switching MOS transistors may be provided instead of the second PMOS transistor 62 to perform gain control.

In FIG. 1, the circuits such as the amplifier circuit 2 and the comparator 3 are arranged only on the lower side of the pixel unit 1, but the present invention is not limited to this. The same circuits as on the lower side may be arranged on the upper side of the pixel unit 1. In this case, it is desirable to determine whether a pixel signal is read on the upper side or the lower side for each column.

In each embodiment, the configuration in which the memory 5 is provided for each column, and the counter circuit 6 for input in common to the memories 5 in the plurality of columns has been described, but the present invention is not limited to this. For example, a counter circuit 6 may be arranged for each column. In each embodiment, the pixel signal from the pixel unit 1 is input to the amplifier circuit 2, but the present invention is not limited to this. For example, the pixel signal may be directly input through a capacitor element to the comparator 3.

The above-described embodiments all merely illustrate embodying examples in carrying out the present invention, and the technical scope of the present invention should not be construed by the embodiments in a limited manner. Specifically, the present invention can be carried out in various manners without departing from the technical idea or the main features.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2011-196058, filed Sep. 8, 2011, which is hereby incorporated by reference herein in its entirety.

What is claimed is:

1. A solid-state imaging apparatus comprising:
a pixel unit including a plurality of pixels for photoelectric conversion arranged in a matrix;
a ramp signal generator configured to generate a first time-changing ramp signal during a first analog-to-digital conversion period, and to generate a second time-changing ramp signal during a second analog-to-digital conversion period;
a plurality of comparators each arranged correspondingly to each of columns of the matrix; and
a plurality of memories each arranged correspondingly to each of columns of the matrix, wherein
the comparators compare the first time-changing ramp signal with a signal according to a release of reset of the pixels during the first analog-to-digital conversion period, and compares the second time-changing ramp signal with a signal according to the photoelectric conversion of the pixels during the second analog-to-digital conversion period,
the memories store, as a first digital data, a count value of counting from a start of changing the first time-changing ramp signal until an inversion of an output of the comparator, during the first analog-to-digital conversion period,
the memories store, as a second digital data, a count value of counting from a start of changing the second time-changing ramp signal until the inversion of the output of the comparator, during the second analog-to-digital conversion period,
the ramp signal generator includes a first capacitor element, and a current generator configured to supply a current to the first capacitor element,
the first capacitor element samples a bias voltage by being supplied the current before the first and second analog-to-digital conversion periods, and holds the bias voltage, and
the ramp signal generator generates the first time-changing ramp signal by using the bias voltage held by the first capacitor, and the second time-changing ramp signal by using the bias voltage, held by the first capacitor, used for generating the first time-changing ramp signal.

2. The solid-state imaging apparatus according to claim 1, wherein the ramp signal generator has a current mirror circuit including first and second transistors,
the current generator is connected to a drain terminal of the first transistor,
the first capacitor element is connected to a gate terminal of the second transistor, and
a switch is connected between a gate terminal of the first transistor and the gate terminal of the second transistor.

3. The solid-state imaging apparatus according to claim 2, wherein the ramp signal generator has a plurality of the second transistors connected in parallel, and is capable of changing a number of the second transistors turned on.

4. The solid-state imaging apparatus according to claim 2, wherein the ramp signal generator has a buffer circuit configured to buffer a voltage based on an output current of the second transistor, to output the first and second time-changing ramp signals.

5. The solid-state imaging apparatus according to claim 4, wherein the ramp signal generator has a second capacitor element connected to the second transistor and to an input terminal of the buffer circuit, to convert an output current of the second transistor to a voltage.

6. The solid-state imaging apparatus according to claim 4, wherein the ramp signal generator has a resistor element connected to the second transistor and an input terminal of the buffer circuit, to convert an output current of the second transistor to a voltage.

7. The solid-state imaging apparatus according to claim 2, wherein the ramp signal generator comprises:
a differential amplifier configured to input an output of the second transistor and a reference voltage, and to output the first and second time-changing ramp signals;
a feedback capacitor connected between an input terminal and output terminal of the differential amplifier; and
a reset switch configured to reset the feedback capacitor.

8. A driving method of a solid-state imaging apparatus comprising:
a pixel unit including a plurality of pixels for photoelectric conversion arranged in a matrix;
a ramp signal generator including a first capacitor element, and a current generator configured to supply a current to the first capacitor element, wherein the ramp signal generator is configured to generate a first time-changing ramp signal during a first analog-to-digital conversion period, and to generate a second time-changing ramp signal during a second analog-to-digital conversion period;
a plurality of comparators each arranged correspondingly to each of columns of the matrix; and
a plurality of memories each arranged correspondingly to each of columns of the matrix, wherein the method comprising steps of:
comparing, by the comparators, the first time-changing ramp signal with a signal according to a releasing reset of the pixels during the first analog-to-digital conversion period, and comparing the second time-changing ramp signal with a signal according to the photoelectric conversion of the pixels during the second analog-to-digital conversion period,
storing, in the memories, as a first digital data, a count value of counting from a start of changing the first ramp signal until an inversion of an output of the comparator, during the first analog-to-digital conversion period,
storing, in the memories, as a second digital data, a count value of counting from a start of changing the second ramp signal until the inversion of the output of the comparator, during the second analog-to-digital conversion period,
sampling, by the first capacitor, a bias voltage by supplying the current before the first and second analog-to-digital conversion periods, and holding the bias voltage, and
generating, by the ramp signal generator, the first time-changing ramp signal by using the bias voltage held by the first capacitor, and the second time-changing ramp signal by using the bias voltage, held by the first capacitor, used for generating the first time-changing ramp signal.

9. The driving method according to claim 8, wherein the ramp signal generator has a current mirror circuit including first and second transistors,
the current generator is connected to a drain terminal of the first transistor,
the first capacitor element is connected to a gate terminal of the second transistor, and
a switch is connected between a gate terminal of the first transistor and the gate terminal of the second transistor.

10. The driving method according to claim 9, wherein the ramp signal generator has a plurality of the second transistors connected in parallel, and is capable of changing a number of the second transistors turned on.

11. The driving method according to claim 9, wherein the ramp signal generator has a buffer circuit configured to buffer a voltage based on an output current of the second transistor, to output the first and second ramp signals.

12. The driving method according to claim 11, wherein the ramp signal generator has a second capacitor element connected to the second transistor and to an input terminal of the buffer circuit, for converting an output current of the second transistor to a voltage.

13. The driving method according to claim 11, wherein
the ramp signal generator has a resistor element connected to the second transistor and an input terminal of the buffer circuit, to convert an output current of the second transistor to a voltage.

14. The driving method according to claim 9, wherein the ramp signal generator comprises:
a differential amplifier configured to input an output of the second transistor and a reference voltage, and to output the first and second time-changing ramp signals;
a feedback capacitor connected between an input terminal and output terminal of the differential amplifier; and
a reset switch configured to reset the feedback capacitor.

\* \* \* \* \*